US012812882B2

(12) United States Patent
Park et al.

(10) Patent No.: US 12,812,882 B2
(45) Date of Patent: Nov. 24, 2026

(54) SEMICONDUCTOR DEVICES

(71) Applicant: SAMSUNG ELECTRONICS CO., LTD., Suwon-si (KR)

(72) Inventors: Jungmin Park, Seoul (KR); Hanjin Lim, Seoul (KR); Hyungsuk Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 308 days.

(21) Appl. No.: 18/767,018

(22) Filed: Jul. 9, 2024

(65) Prior Publication Data

US 2024/0363678 A1 Oct. 31, 2024

Related U.S. Application Data

(63) Continuation of application No. 17/809,727, filed on Jun. 29, 2022, now Pat. No. 12,057,470.

(30) Foreign Application Priority Data

Nov. 19, 2021 (KR) ........................ 10-2021-0160384

(51) Int. Cl.
*H10D 1/68* (2025.01)
*H10B 12/00* (2023.01)

(52) U.S. Cl.
CPC ........... *H10D 1/682* (2025.01); *H10B 12/482* (2023.02); *H10D 1/694* (2025.01); *H10D 1/696* (2025.01); *H10D 1/711* (2025.01)

(58) Field of Classification Search
CPC ...... H10D 1/682; H10B 12/482; H10B 1/694; H10B 1/696; H10B 1/711
See application file for complete search history.

(56) References Cited

U.S. PATENT DOCUMENTS 5,866,238 A 2/1999 Takayama et al.
7,279,392 B2 10/2007 Lee et al.
(Continued)

FOREIGN PATENT DOCUMENTS

CN 111668372 A 9/2020
CN 112635561 A 4/2021
(Continued)

OTHER PUBLICATIONS

B. Noheda et al., "Thermal expansion anomalies at the antiferroelectric-ferroelectric (FRL), ferroelectric (FRL)-ferroelectric (FRH) and ferroelectric (FRH)-paraelectric transitions in PbZr1-xTixO3 (0)·x·0. 35," 1997, Journal of Materials Science Letters, 16 (1997) 101-103.

*Primary Examiner* — Richard A Booth
(74) *Attorney, Agent, or Firm* — Morgan, Lewis & Bockius LLP

(57) ABSTRACT

A semiconductor device includes a capacitor. The capacitor includes a bottom electrode, a dielectric layer, and a top electrode that are sequentially stacked in a first direction. The dielectric layer includes a first dielectric layer and a second dielectric layer that are interposed between the bottom electrode and the top electrode and are stacked in the first direction. The first dielectric layer is anti-ferroelectric, and the second dielectric layer is ferroelectric. A thermal expansion coefficient of the first dielectric layer is greater than a thermal expansion coefficient of the second dielectric layer.

20 Claims, 9 Drawing Sheets

(56) References Cited

U.S. PATENT DOCUMENTS

| | | | | |
|---|---|---|---|---|
| 7,297,591 | B2 | 11/2007 | Won et al. | |
| 10,553,673 | B2 | 2/2020 | Nahar et al. | |
| 10,825,893 | B2 * | 11/2020 | Cho | H10B 12/033 |
| 11,101,362 | B2 | 8/2021 | Chen et al. | |
| 11,193,206 | B2 | 12/2021 | Lei et al. | |
| 11,527,646 | B2 | 12/2022 | Heo et al. | |
| 12,568,629 | B2 * | 3/2026 | Park | H10B 53/30 |
| 2002/0102791 | A1 | 8/2002 | Kurasawa et al. | |
| 2003/0162394 | A1 | 8/2003 | Takemura | |
| 2020/0194443 | A1 | 6/2020 | Lin et al. | |
| 2020/0286984 | A1 | 9/2020 | Chang et al. | |
| 2021/0225699 | A1 | 7/2021 | Tsen et al. | |
| 2021/0328004 | A1 * | 10/2021 | Lee | H01G 4/06 |
| 2022/0093603 | A1 | 3/2022 | Cho et al. | |
| 2022/0238641 | A1 | 7/2022 | Park et al. | |
| 2023/0015379 | A1 | 1/2023 | Luo et al. | |
| 2023/0163160 | A1 | 5/2023 | Park et al. | |
| 2023/0290811 | A1 * | 9/2023 | Park | H10B 53/30 |
| 2024/0099017 | A1 | 3/2024 | Park et al. | |

FOREIGN PATENT DOCUMENTS

| | | | |
|---|---|---|---|
| KR | 10-2003-0071586 | A | 9/2003 |
| KR | 10-2019-0120432 | A | 10/2019 |
| KR | 10-2021-0092437 | A | 7/2021 |
| KR | 10-2022-0038918 | A | 3/2022 |
| TW | 202008590 | A | 2/2020 |

* cited by examiner

SEMICONDUCTOR DEVICES

CROSS-REFERENCE TO RELATED APPLICATIONS

This U.S. non-provisional patent application is a continuation of U.S. patent application Ser. No. 17/809,727, filed on Jun. 29, 2022 in the U.S. Patent and Trademark Office, which claims priority under 35 U.S.C. § 119 from Korean Patent Application No. 10-2021-0160384, filed on Nov. 19, 2021 in the Korean Intellectual Property Office, the contents of both of which are herein incorporated by reference in their entireties.

TECHNICAL FIELD

Embodiments of the present disclosure are directed to a semiconductor device and a method of fabricating the same, and in particular, to a semiconductor memory device and a method of fabricating the same.

DISCUSSION OF THE RELATED ART

Due to their small-sized, multifunctional, and/or low-cost characteristics, semiconductor devices are important elements in the electronics industry. Semiconductor devices are classified as semiconductor memory devices for storing data, semiconductor logic devices for processing data, and hybrid semiconductor devices that include both memory and logic elements.

As integration densities of semiconductor devices increase, a capacitor is needed that has a sufficiently high capacitance in a limited area. The electrostatic capacitance of the capacitor is proportional to a surface area of an electrode and a dielectric constant of a dielectric layer and is inversely proportional to an equivalent oxide thickness of the dielectric layer.

SUMMARY

An embodiment of the inventive concept provides a semiconductor device that has a capacitor with an increased electrostatic capacitance and a method of fabricating the same.

An embodiment of the inventive concept provides a semiconductor device in which a fine structure of a dielectric layer in the capacitor can be easily controlled, and a method of fabricating the same.

According to an embodiment of the inventive concept, a semiconductor device includes a capacitor. The capacitor includes a bottom electrode, a dielectric layer, and a top electrode that are sequentially stacked in a first direction perpendicular to an interface between each of the bottom electrodes and the dielectric layer. The dielectric layer includes a first dielectric layer and a second dielectric layer that are stacked in the first direction and are interposed between the bottom electrode and the top electrode. The first dielectric layer is anti-ferroelectric, and the second dielectric layer is ferroelectric. A thermal expansion coefficient of the first dielectric layer is greater than a thermal expansion coefficient of the second dielectric layer.

According to an embodiment of the inventive concept, a semiconductor device includes a substrate; a plurality of bottom electrodes disposed on the substrate and that are horizontally spaced apart from each other; a top electrode that covers the bottom electrodes; and a dielectric layer interposed between each of the bottom electrodes and the top electrode. The dielectric layer includes a first dielectric layer and a second dielectric layer that are stacked in a direction perpendicular to an interface between each of the bottom electrodes and the dielectric layer. The first dielectric layer is anti-ferroelectric, and the second dielectric layer is ferroelectric. A thermal expansion coefficient of the first dielectric layer is greater than a thermal expansion coefficient of the second dielectric layer.

According to an embodiment of the inventive concept, a semiconductor device includes a capacitor. The capacitor includes a bottom electrode, a dielectric layer, and a top electrode that are sequentially stacked in a first direction perpendicular to an interface between each of the bottom electrodes and the dielectric layer. The dielectric layer is interposed between the bottom electrode and the top electrode and includes a first dielectric layer and a second dielectric layer that are stacked in the first direction. The first dielectric layer comprises an anti-ferroelectric first crystal phase, the second dielectric layer comprises a ferroelectric second crystal phase, and at least one of the first and second dielectric layers further comprises a paraelectric sub-crystal phase. In the dielectric layer, a fraction of the sub-crystal phase is less than a fraction of the first crystal phase and a fraction of the second crystal phase.

DETAILED DESCRIPTION

Embodiments of the inventive concepts will now be described more fully with reference to the accompanying drawings, in which embodiments are shown.

Figure 1:
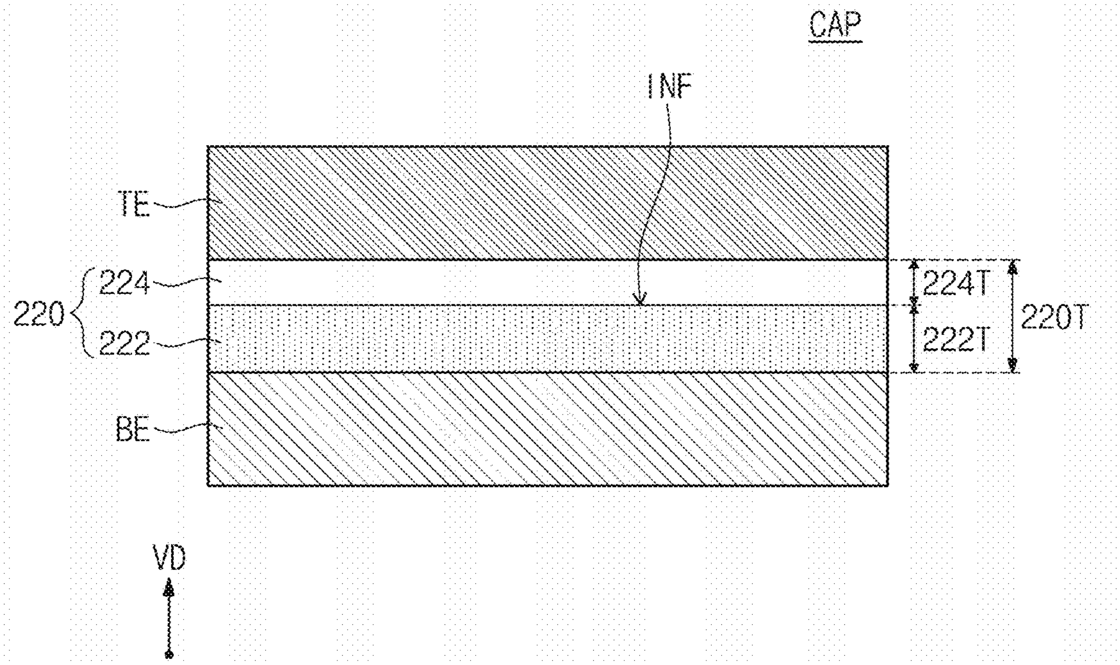
FIG. 1 is a sectional view of a capacitor of a semiconductor device according to an embodiment of the inventive concept.

FIG. 1 is a sectional view of a capacitor of a semiconductor device according to an embodiment of the inventive concept.

Referring to FIG. 1, in an embodiment, a semiconductor device includes a capacitor structure CAP, and the capacitor structure CAP includes a bottom electrode BE, a dielectric layer 220, and a top electrode TE that are sequentially stacked in a first direction VD. The dielectric layer 220 is interposed between the bottom electrode BE and the top electrode TE, and the first direction VD is perpendicular to an interface between the bottom electrode BE and the dielectric layer 220. The dielectric layer 220 includes a first dielectric layer 222 and a second dielectric layer 224 that are stacked in the first direction VD between the bottom electrode BE and the top electrode TE. In some embodiments, the first dielectric layer 222 is interposed between the bottom electrode BE and the second dielectric layer 224, and the second dielectric layer 224 is interposed between the first dielectric layer 222 and the top electrode TE, but embodiments of the inventive concept are not necessarily limited to this example. In another embodiment, unlike the illustrated structure, the second dielectric layer 224 is interposed between the bottom electrode BE and the first dielectric layer 222, and the first dielectric layer 222 is interposed between the second dielectric layer 224 and the top electrode TE.

The first dielectric layer 222 is formed of or includes at least one anti-ferroelectric material or a material that has an electric field-induced phase transition property. For example, the first dielectric layer 222 is formed of or includes at least one of $PbZrO_3$, $AgNbO_3$, $ZrO_2$, or $HfZrO_2$, but embodiments of the inventive concept are not necessarily limited to these materials. The second dielectric layer 224 is formed of or include at least one ferroelectric material. For example, the second dielectric layer 224 is formed of or includes at least one of $BaTiO_3$, $HfO_2$, $BiFeO_3$, PbTiO, or $Hf_{0.5}Zr_{0.5}O_2$, but embodiments of the inventive concept are not necessarily limited to these materials.

A thermal expansion coefficient of the first dielectric layer 222 differs from a thermal expansion coefficient of the second dielectric layer 224. The thermal expansion coefficient of the first dielectric layer 222 is greater than the thermal expansion coefficient of the second dielectric layer 224. For example, the thermal expansion coefficient of the first dielectric layer 222 is greater than or equal to $8.0\times10^{-6}$/K, and the thermal expansion coefficient of the second dielectric layer 224 is greater than or equal to $5.0\times10^{-6}$/K. For example, a difference between the thermal expansion coefficients of the first and second dielectric layers 222 and 224 is greater than or equal to $3.0\times10^{-6}$/K and less than or equal to $10.0\times10^{-6}$/K.

Since the first and second dielectric layers 222 and 224 have different thermal expansion coefficients, a tensile or compressive stress is produced at an interface INF between the first and second dielectric layers 222 and 224. When the thermal expansion coefficient of the first dielectric layer 222 is greater than the thermal expansion coefficient of the second dielectric layer 224, a tensile stress is exerted on the first dielectric layer 222 and a compressive stress is exerted on the second dielectric layer 224. Due to the stress at the interface INF, a crystal phase and grain size of each of the first and second dielectric layers 222 and 224 can be controlled. In an embodiment, the difference between the thermal expansion coefficients of the first and second dielectric layers 222 and 224 is greater than or equal to $3.0\times10^{-6}$/K, and due to the stress at the interface INF, the crystal phase and grain size of each of the first and second dielectric layers 222 and 224 can be controlled.

The first dielectric layer 222 includes a first crystal phase that is anti-ferroelectric or has an electric field-induced phase transition. The first crystal phase is at least one of a tetragonal, an orthorhmobic, or a rhombohedral phase. The first dielectric layer 222 further includes a paraelectric sub-crystal phase, and the sub-crystal phase is a monoclinic phase. Due to the stress at the interface INF between the first and second dielectric layers 222 and 224, formation of the first crystal phase is increased and formation of the sub-crystal phase is suppressed in the first dielectric layer 222. For example, in the first dielectric layer 222, a fraction of the first crystal phase is greater than a fraction of the sub-crystal phase. According to an embodiment of the inventive concept, by adjusting the difference between the thermal expansion coefficients of the first and second dielectric layers 222 and 224, the first dielectric layer 222 can be controlled to increase the fraction of the first crystal phase and decrease the fraction of the sub-crystal phase.

The second dielectric layer 224 includes a ferroelectric second crystal phase. The ferroelectric second crystal phase is at least one of a tetragonal, an orthorhmobic, or a rhombohedral phase. The second dielectric layer 224 further includes a paraelectric sub-crystal phase. Due to the stress at the interface INF between the first and second dielectric layers 222 and 224, formation of the second crystal phase is increased and formation of the sub-crystal phase is suppressed in the second dielectric layer 224. That is, in the second dielectric layer 224, a fraction of the second crystal phase is greater than the fraction of the sub-crystal phase. According to an embodiment of the inventive concept, by adjusting the difference between the thermal expansion coefficients of the first and second dielectric layers 222 and 224, the fraction of the sub-crystal phase can be reduced and to increase the fraction of the second crystal phase in the second dielectric layer 224.

In the dielectric layer 220, a fraction of the first crystal phase is greater than a fraction of the second crystal phase. For example, in the dielectric layer 220, the fraction of the first crystal phase is greater than or equal to 70%, and the fraction of the second crystal phase is less than or equal to 30%. In the dielectric layer 220, a fraction of the sub-crystal phase is less than the fraction of the first crystal phase and is less than the fraction of the second crystal phase. For example, the fraction of the sub-crystal phase in the dielectric layer 220 is less than 10%. By adjusting the difference between the thermal expansion coefficients of the first and second dielectric layers 222 and 224, the fractions of the first crystal phase, the second crystal phase, and the sub-crystal phases in the dielectric layer 220 can be controlled. In addition, by adjusting the difference between the thermal expansion coefficients of the first and second dielectric layers 222 and 224, a grain size of the first and second dielectric layers 222 and 224 can be controlled to be less than 5 Å.

Each of the dielectric layer 220, the first dielectric layer 222, and the second dielectric layer 224 has a thickness in the first direction VD perpendicular to the interface INF between the first and second dielectric layers 222 and 224. A thickness 222T of the first dielectric layer 222 differs from a thickness 224T of the second dielectric layer 224. For example, the thickness 222T of the first dielectric layer 222 is greater than the thickness 224T of the second dielectric layer 224. For example, the thickness 222T of the first dielectric layer 222 is greater than 70% of a total thickness 220T of the dielectric layer 220, and the thickness 224T of the second dielectric layer 224 is less than 30% of the total thickness 220T of the dielectric layer 220. The total thickness 220T of the dielectric layer 220 is less than or equal to 60 Å. In example embodiments, each of the thicknesses 222T and 224T of the first and second dielectric layers 222 and 224 is less than or equal to 10 Å. For example, each of the thicknesses 222T and 224T of the first and second dielectric layers 222 and 224 ranges from 5 Å to 10 Å. In this case, the total thickness 220T of the dielectric layer 220 is less than or equal to 20 Å.

The bottom electrode BE is formed of or includes at least one of doped polysilicon, a metal nitride, such as titanium nitride, or a metal, such as tungsten, aluminum, or copper. The top electrode TE is formed of or includes at least one of doped polysilicon, doped silicon germanium, a metal nitride, such as titanium nitride, or a metal, such as tungsten, aluminum, or copper.

In an embodiment, the bottom electrode BE, the dielectric layer 220, and the top electrode TE are deposited by a chemical vapor deposition method or a physical vapor deposition method. In an embodiment, the deposition temperature of the bottom and top electrodes BE and TE ranges from 450° C. to 700° C., and the deposition temperature of the dielectric layer 220, such as the first and second dielectric layers 222 and 224, is less than about 400° C. An annealing process is performed on the dielectric layer 220, and the temperature of the annealing process ranges from 200° C. to 700° C.

According to an embodiment of the inventive concept, the dielectric layer 220 has a multi-layered structure, in which the anti-ferroelectric or electric field-induced phase transition first dielectric layer 222 property and the ferroelectric second dielectric layer 224 are stacked. The first and second dielectric layers 222 and 224 have different thermal expansion coefficients from each other. By adjusting the difference between the thermal expansion coefficients of the first and second dielectric layers 222 and 224, e.g., to a value that is greater than or equal to $3.0\times10^{-6}$/K, a tensile or compressive stress at the interface INF between the first and second dielectric layers 222 and 224 can be produced, and a fine structure of the dielectric layer 220, such as a crystal phase and a grain size of the first and second dielectric layers 222 and 224, can be controlled to maximize an electrostatic capacitance of the capacitor structure CAP. Accordingly, in a semiconductor device and a fabrication method according to an embodiment of the inventive concept, an electrostatic capacitance of the capacitor structure CAP can be increased and a fine structure of the dielectric layer 220 can be controlled.

Figure 2:
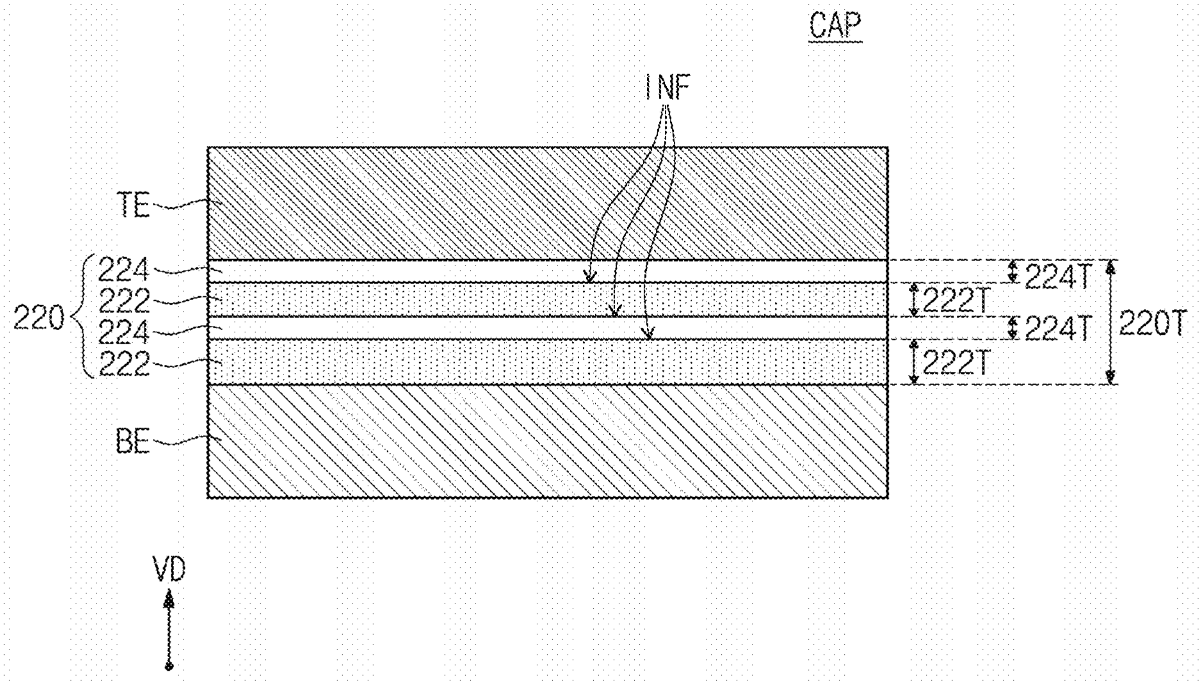
FIGS. 2 and 3 are sectional views of a capacitor of a semiconductor device according to an embodiment of the inventive concept.
Figure 3:
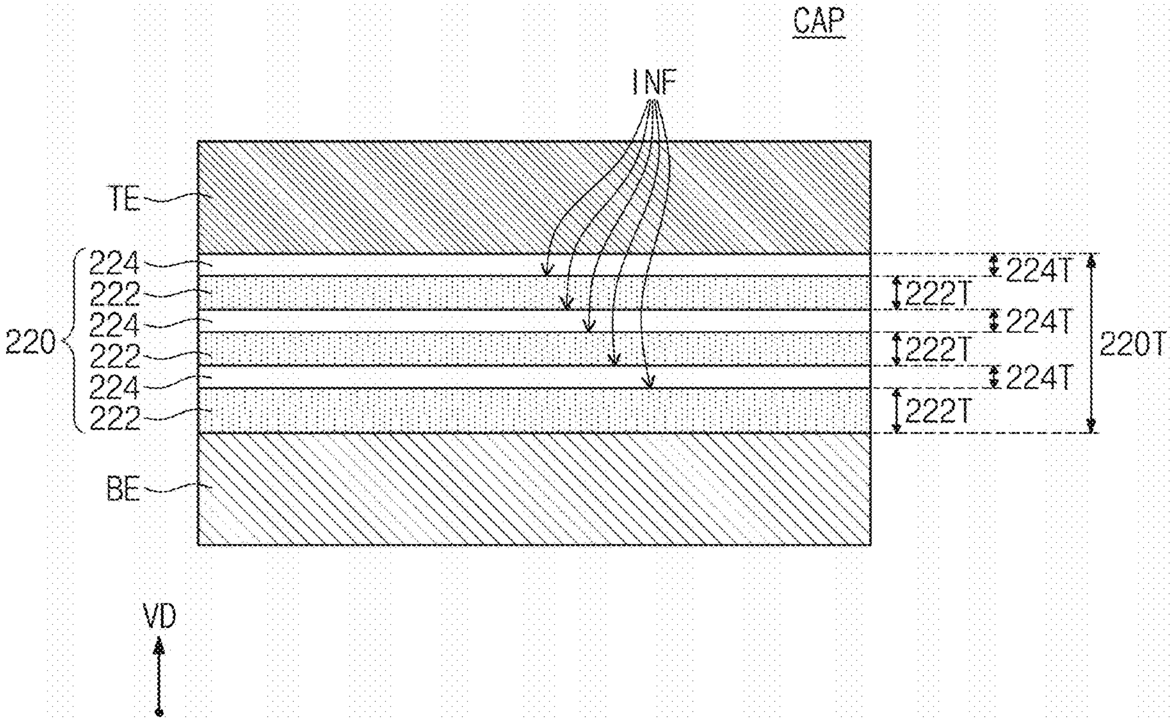

FIGS. 2 and 3 are sectional views of a capacitor of a semiconductor device according to an embodiment of the inventive concept. For concise description, the description that follows will focus mainly on features that differ from those in a capacitor described with reference to FIG. 1.

Referring to FIGS. 2 and 3, in an embodiment, the dielectric layer 220 include a plurality of first dielectric layers 222 and a plurality of second dielectric layers 224, which are provided between the bottom and top electrodes BE and TE and are alternately stacked in the first direction VD. In an embodiment, the lowermost first dielectric layer 222 is interposed between the lowermost second dielectric layer 224 and the bottom electrode BE, but embodiments of the inventive concept are not necessarily limited to this example. In another embodiment, the lowermost second dielectric layer 224 is interposed between the lowermost first dielectric layer 222 and the bottom electrode BE.

Each of the first dielectric layers 222 is the same as the first dielectric layer 222 described with reference to FIG. 1, and each of the second dielectric layers 224 is the same as the second dielectric layer 224 described with reference to FIG. 1. Since the first dielectric layers 222 have a thermal expansion coefficient that differs from the second dielectric layers 224, a tensile or compressive stress is produced at interfaces INF between the first and second dielectric layers 222 and 224. Due to the stress at the interfaces INF between the first and second dielectric layers 222 and 224, a crystal phase and a grain size of each of the first and second dielectric layers 222 and 224 can be controlled.

A thickness 222T of each of the first dielectric layers 222 is equal to or different from a thickness 224T of each of the second dielectric layers 224. In an embodiment, the thickness 222T of each of the first dielectric layers 222 is greater than the thickness 224T of each of the second dielectric layers 224. A ratio of a sum of the thicknesses 222T of the first dielectric layers 222 to a total thickness 220T of the dielectric layer 220 is greater than a ratio of a sum of the thicknesses 224T of the second dielectric layers 224 to the total thickness 220T. For example, the sum of the thicknesses 222T of the first dielectric layers 222 is greater than or equal to 70% of the total thickness 220T of the dielectric layer 220, and the sum of the thicknesses 224T of the second dielectric layers 224 is less than or equal to 30% of the total thickness 220T of the dielectric layer 220. The total thickness 220T of the dielectric layer 220 is less than or equal to 60 Å. The thickness 222T of each of the first dielectric layers 222 is less than or equal to 10 Å, and the thickness 224T of each of the second dielectric layers 224 is less than or equal to 10 Å. For example, the thickness 222T of each of the first dielectric layers 222 ranges from 5 Å to 10 Å, and the thickness 224T of each of the second dielectric layers 224 ranges from 5 Å to 10 Å.

The dielectric layer 220 has a structure in which two first dielectric layers 222 and two second dielectric layers 224 are alternately stacked as shown in FIG. 2, or in which three first dielectric layers 222 and three second dielectric layers 224 are alternately stacked as shown in FIG. 3. However, embodiments of the inventive concept are not necessarily limited to this example. For example, in an embodiment, the number of the first dielectric layers 222 of the dielectric layer 220 differs from the number of the second dielectric layers 224.

Figure 4:
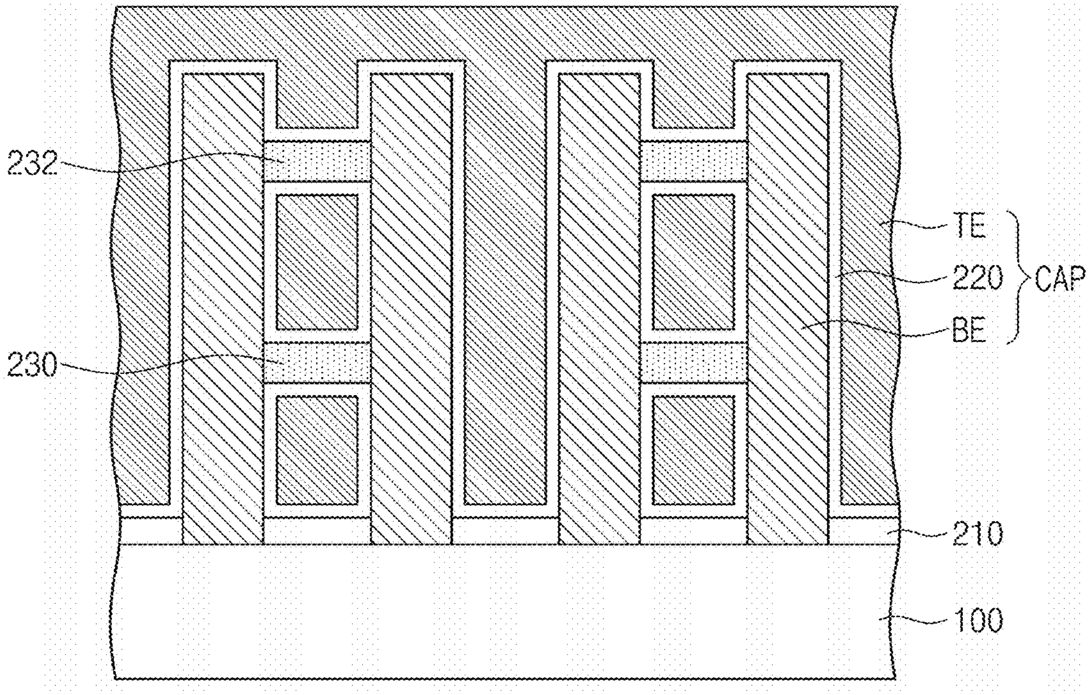
FIG. 4 is a sectional view of a portion of a semiconductor device according to an embodiment of the inventive concept.

FIG. 4 is a sectional view of a portion of a semiconductor device according to an embodiment of the inventive concept.

Referring to FIG. 4, in an embodiment, a capacitor CAP is disposed on a substrate 100. The substrate 100 is a semiconductor substrate, such as a silicon wafer, a germanium wafer, or a silicon-germanium wafer. The capacitor CAP includes a plurality of bottom electrodes BE disposed on the substrate 100, a top electrode TE that covers the bottom electrodes BE, and a dielectric layer 220 interposed between each of the bottom electrodes BE and the top electrode TE.

The bottom electrodes BE on the substrate 100 are horizontally spaced apart from each other. In an embodiment, each of the bottom electrodes BE has a pillar shape. The bottom electrodes BE are formed of or include at least one of doped poly-silicon, a metal nitride, such as titanium nitride, or a metal, such as tungsten, aluminum, or copper.

A lower supporting pattern 230 is disposed on lower side surfaces of the bottom electrodes BE, and an upper supporting pattern 232 is disposed on upper side surfaces of the bottom electrodes BE. The lower supporting pattern 230 are in contact with the lower side surfaces of the bottom electrodes BE and support the lower side surfaces of the bottom electrodes BE. The upper supporting pattern 232 are in contact with the upper side surfaces of the bottom electrodes BE and support the upper side surfaces of the bottom electrodes BE. The lower and upper supporting patterns 230 and 232 are formed of or include at least one insulating materials, such as silicon nitride, silicon oxide, or silicon oxynitride. The lower and upper supporting patterns 230 and 232 are formed between pairs of adjacent bottom electrodes BE. In an embodiment, the lower and upper supporting patterns 230 and 232 connect the pairs of adjacent bottom electrodes BE.

The dielectric layer 220 covers the bottom electrodes BE and the lower and upper supporting patterns 230 and 232. The dielectric layer 220 has substantially the same features as the dielectric layer 220 described with reference to FIGS. 1 to 3. For example, the dielectric layer 220 has a multi-layered structure in which at least one first dielectric layer 222 and at least one second dielectric layer 224 are stacked in a direction perpendicular to an interface between each of the bottom electrodes BE and the dielectric layer 220, as described with reference to FIGS. 1 to 3.

The top electrode TE is disposed on the dielectric layer 220 and fills spaces between the bottom electrodes BE and between the lower supporting pattern 230 and the upper supporting pattern 232. The top electrode TE is formed of or includes at least one of doped poly-silicon, doped silicon germanium, a metal nitride, such as titanium nitride, or a metal, such as tungsten, aluminum, or copper.

An etch stop layer 210 is disposed on the substrate 100 and between the bottom electrodes BE. The top electrode TE is disposed on and covers the etch stop layer 210, and the dielectric layer 220 extends into a region between the etch stop layer 210 and the top electrode TE. The etch stop layer 210 is formed of or includes at least one insulating material, such as silicon nitride, silicon oxide, or silicon oxynitride.

Figure 5:
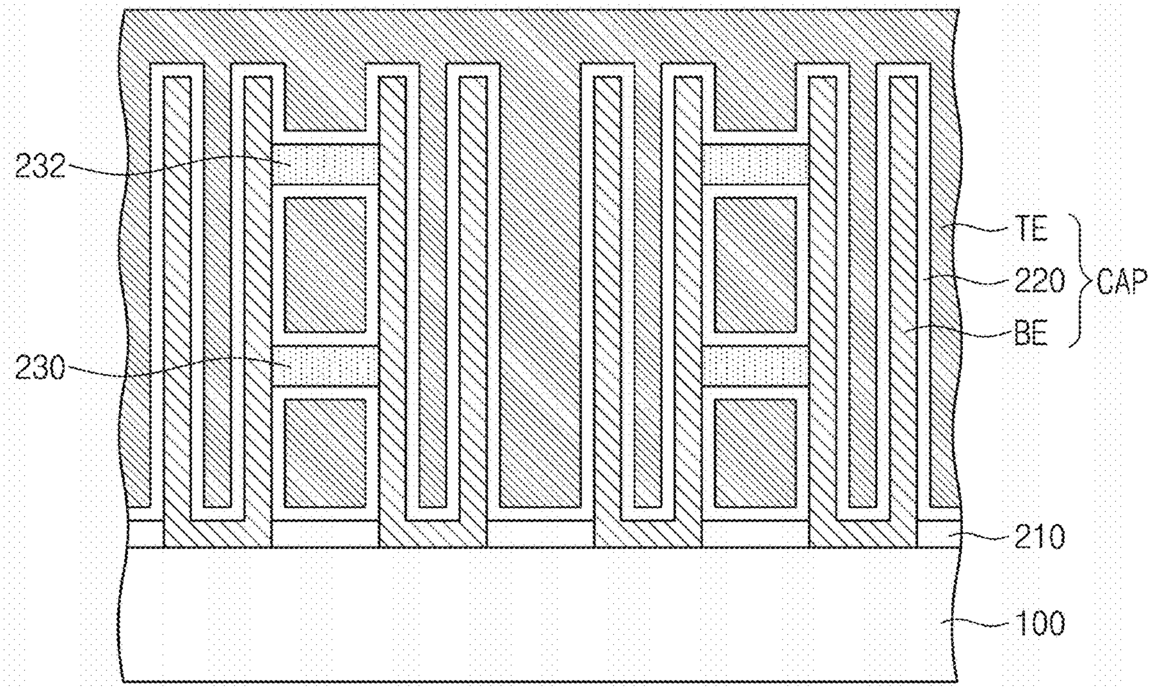
FIGS. 5 and 6 are sectional views of a portion of a semiconductor device according to an embodiment of the inventive concept.
Figure 6:
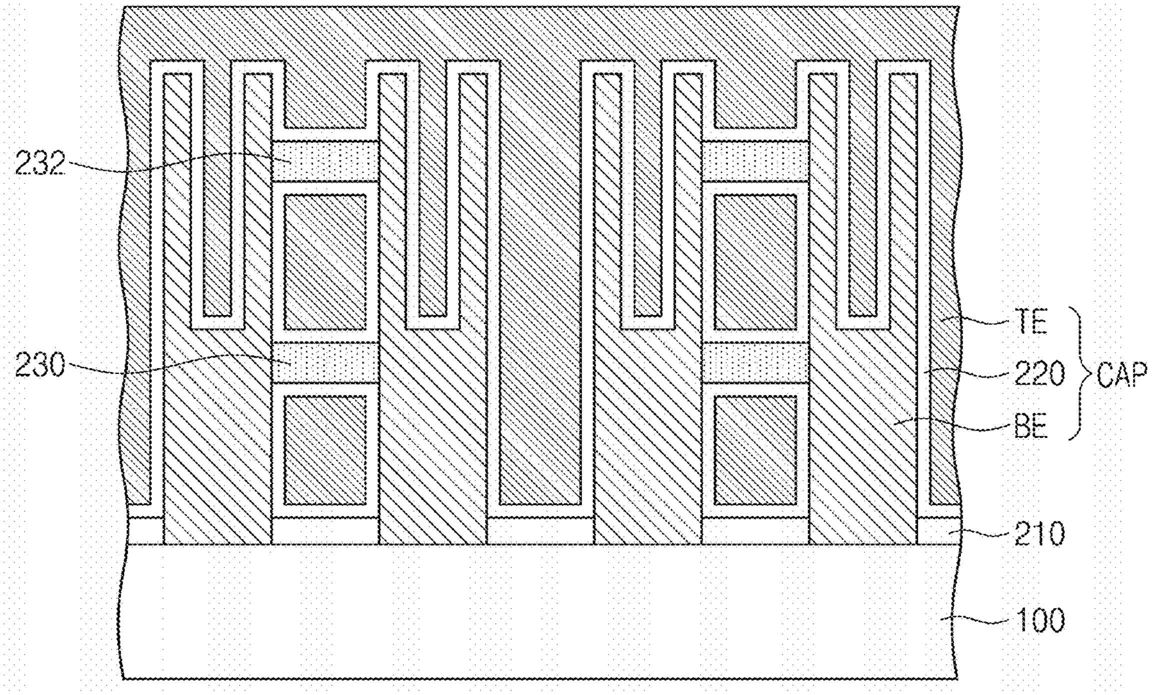

FIGS. 5 and 6 are sectional views of a portion of a semiconductor device according to an embodiment of the inventive concept. For concise description, the description that follows will focus on features that differ from those in a semiconductor device described with reference to FIG. 4.

Referring to FIGS. 5 and 6, in an embodiment, the bottom electrodes BE on the substrate 100 are horizontally spaced apart from each other.

In an embodiment, each of the bottom electrodes BE has a hollow cylinder shape with one closed end that has a cup shape, as shown in FIG. 5. Each of the bottom electrodes BE has an outer side surface and an inner side surface that are opposite to each other. The lower supporting pattern 230 is disposed on lower outer side surfaces of the bottom electrodes BE, and the upper supporting pattern 232 is disposed on upper outer side surfaces of the bottom electrodes BE. The lower supporting pattern 230 is in contact with the lower outer side surfaces of the bottom electrodes BE and supports the lower outer side surfaces of the bottom electrodes BE. The upper supporting pattern 232 is in contact with the upper outer side surfaces of the bottom electrodes BE and supports the upper outer side surfaces of the bottom electrodes BE. The top electrode TE covers the outer side surface of each of the bottom electrodes BE and faces the inner side surface of each of the bottom electrodes BE. The dielectric layer 220 extends into regions between the outer side surface of each of the bottom electrodes BE and the top electrode TE and between the inner side surface of each of the bottom electrodes BE and the top electrode TE.

In an embodiment, each of the bottom electrodes BE has a semi-pillar shape, as shown in FIG. 6. For example, each of the bottom electrodes BE has a lower portion with a pillar shape and an upper portion with a hollow cylinder shape. When each of the bottom electrodes BE has a semi-pillar shape, the upper portion of each of the bottom electrodes BE has an inner side surface and an outer side surface that are opposite to each other. The lower supporting pattern 230 is disposed on lower side surfaces of the bottom electrodes BE, such as a side surface of the lower portion of each of the bottom electrodes BE, and the upper supporting pattern 232 is disposed on upper side surfaces of the bottom electrodes BE, such as the outer side surface of the upper portion of each of the bottom electrodes BE. The lower supporting pattern 230 is in contact with the lower side surfaces of the bottom electrodes BE and support the lower side surfaces of the bottom electrodes BE. The upper supporting pattern 232 is in contact with the upper side surfaces of the bottom electrodes BE and supports the upper side surfaces of the bottom electrodes BE. The top electrode TE covers the outer side surface of the upper portion of each of the bottom electrodes BE and faces the inner side surface of the upper portion of each of the bottom electrodes BE. In addition, the top electrode TE covers a side surface of the lower portion of each of the bottom electrodes BE. The dielectric layer 220 extends into regions between the side surface of the lower portion of each of the bottom electrodes BE and the top electrode TE, between the outer side surface of the upper portion of each of the bottom electrodes BE and the top electrode TE, and between the inner side surface of each of the bottom electrodes BE and the top electrode TE.

Figure 7:
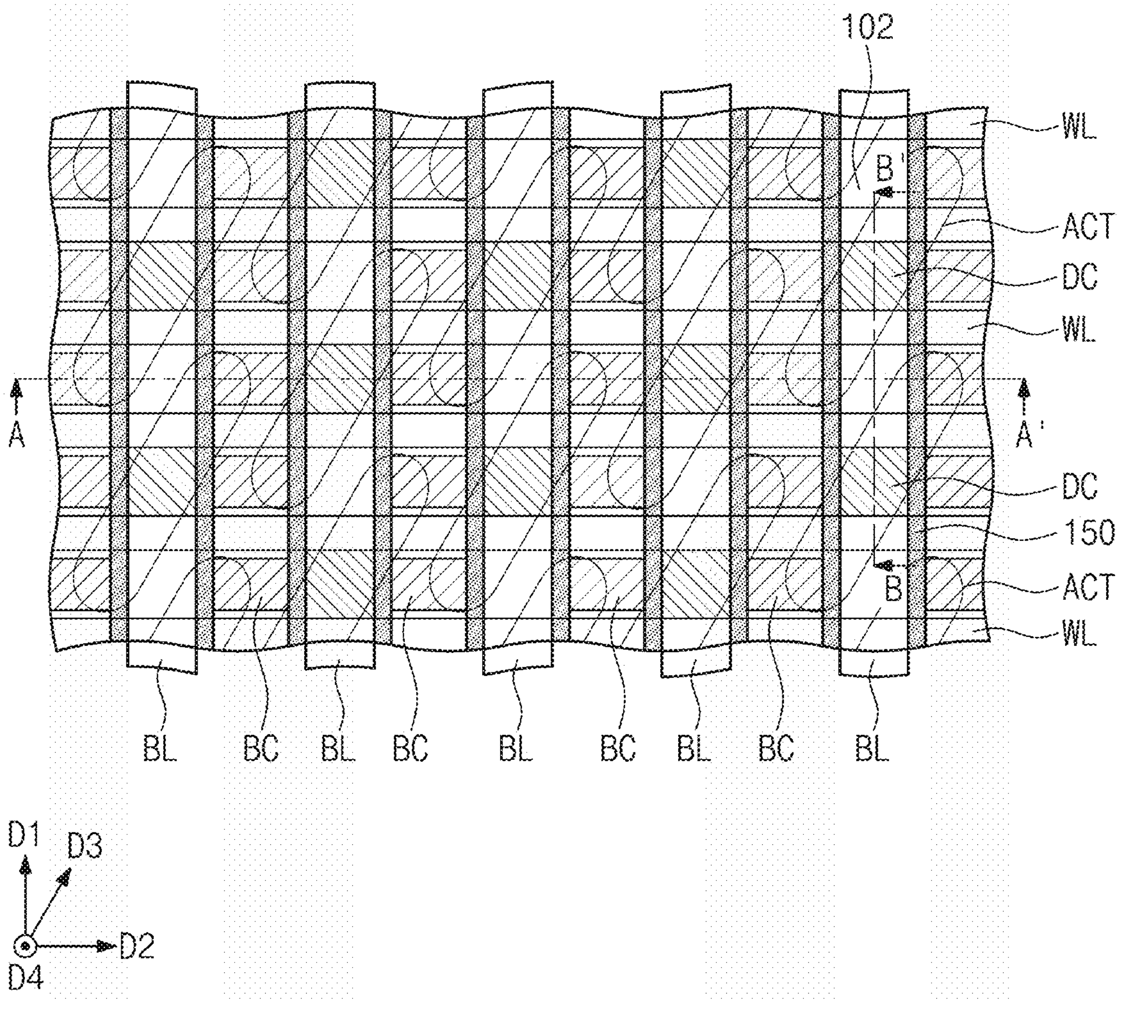
FIG. 7 is a plan view of a semiconductor device according to an embodiment of the inventive concept.
Figure 8:
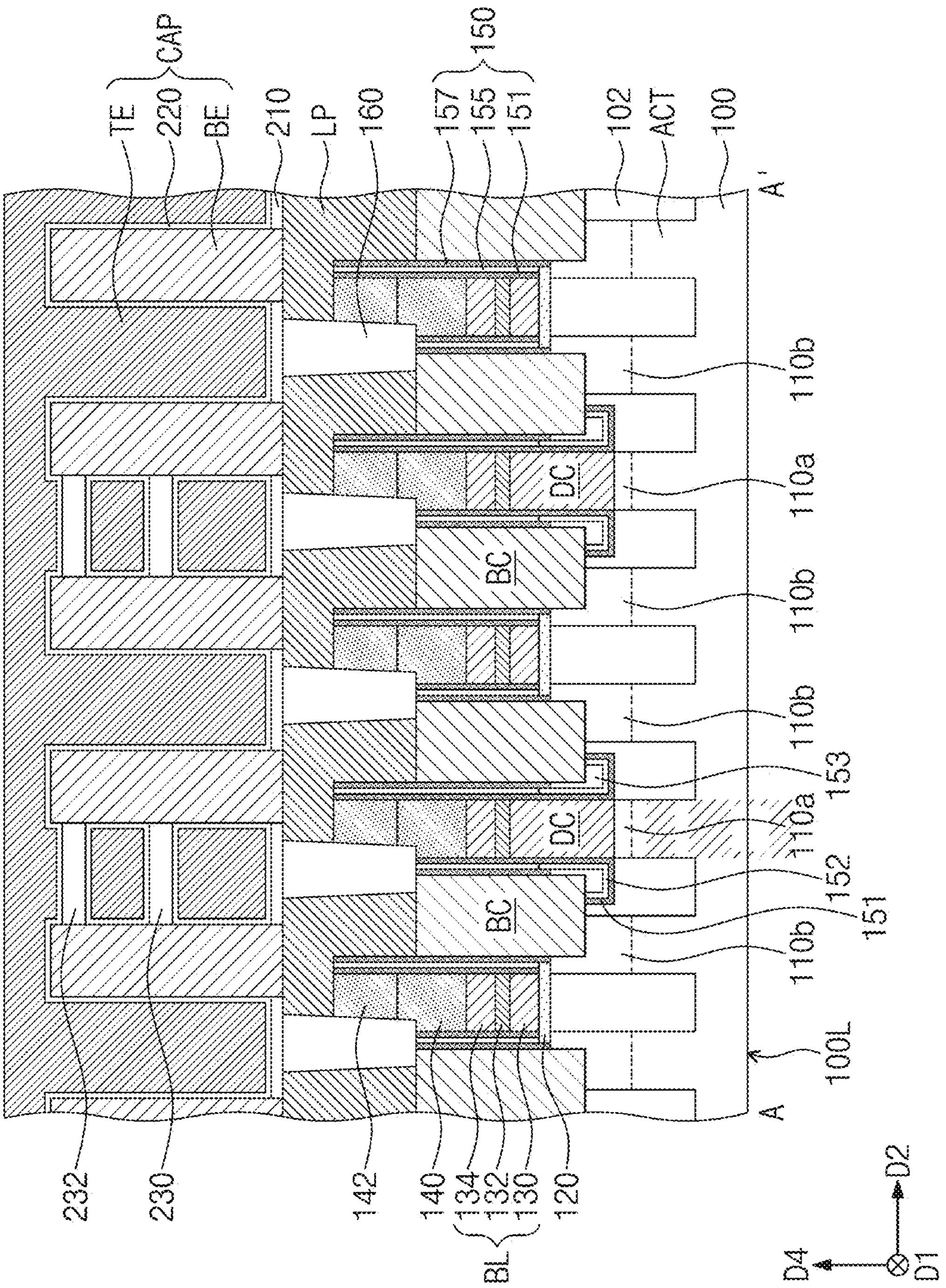
FIG. 8 is a sectional view taken along a line A-A' of FIG. 7.

FIG. 7 is a plan view of a semiconductor device according to an embodiment of the inventive concept. FIG. 8 is a sectional view taken along a line A-A' of FIG. 7, and FIG. 9 is a sectional view taken along a line B-B' of FIG. 7.

Figure 9:
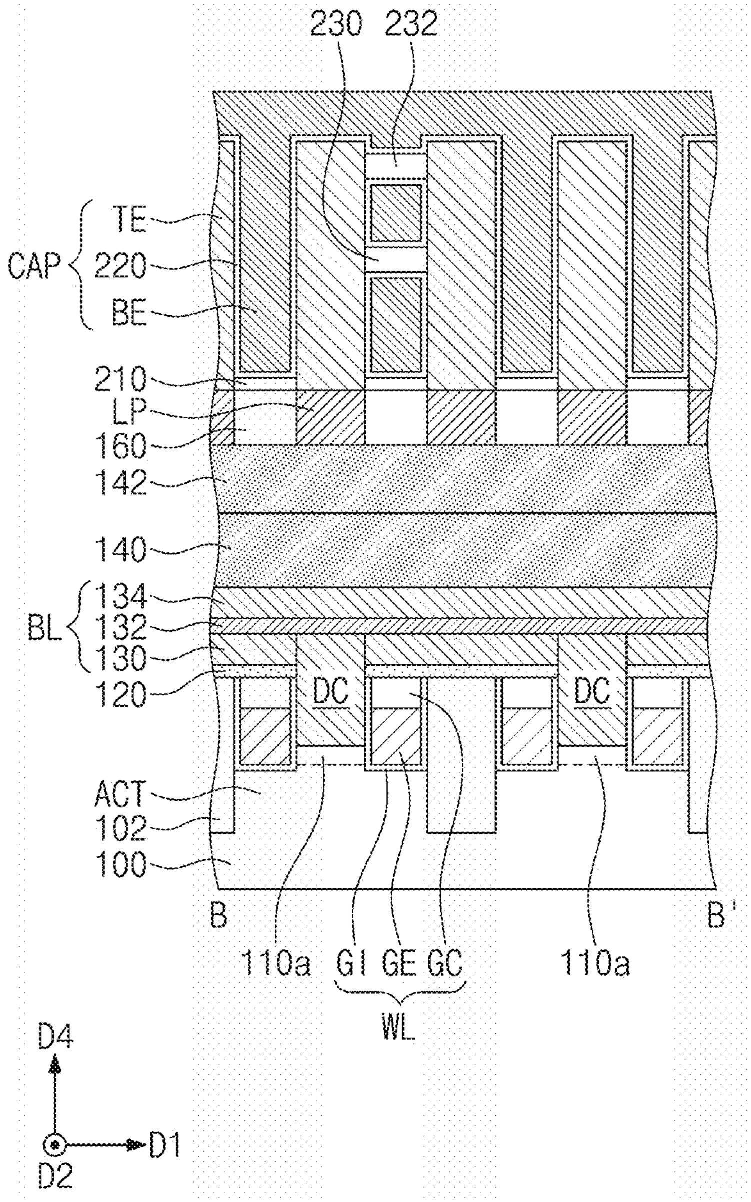
FIG. 9 is a sectional view taken along a line B-B' of FIG. 7.

Referring to FIGS. 7 to 9, in an embodiment, a substrate 100 includes active patterns ACT. The substrate 100 is a semiconductor substrate, such as a silicon wafer, a germanium wafer, or a silicon-germanium wafer. The active patterns ACT are spaced apart from each other in a first direction D1 and a second direction D2 that are parallel to a bottom surface 100L of the substrate 100. The first and second directions D1 and D2 are not parallel to each other. In an embodiment, the first and second directions D1 and D2 are perpendicular to each other. Each of the active patterns ACT is a bar-shaped pattern that extends in a third direction D3 that is parallel to the bottom surface 100L of the substrate 100 but is not parallel to the first and second directions D1 and D2. Each of the active patterns ACT is a portion of the substrate 100 that protrudes in a fourth direction D4 perpendicular to the bottom surface 100L of the substrate 100.

A device isolation layer 102 is disposed on the substrate 100 to define the active patterns ACT. The device isolation layer 102 is interposed between the active patterns ACT and is formed of or includes at least one of silicon oxide, silicon nitride, and/or silicon oxynitride.

Word lines WL are disposed in the substrate 100 and cross the active patterns ACT and the device isolation layer 102. The word lines WL are spaced apart from each other in the first direction D1 and extend in the second direction D2. The word lines WL are buried and are disposed in the active patterns ACT and the device isolation layer 102.

Each of the word lines WL includes a gate electrode GE that penetrates upper portions of the active patterns ACT and the device isolation layer 102, a gate dielectric pattern GI interposed between the gate electrode GE and the active patterns ACT and between the gate electrode GE and the device isolation layer 102, and a gate capping pattern GC disposed on a top surface of the gate electrode GE. A top surface of the gate capping pattern GC is coplanar with top surfaces of the device isolation layer 102. For example, the top surface of the gate capping pattern GC is located at the same height as the top surfaces of the device isolation layer 102.

The gate electrode GE includes a conductive material. In an embodiment, the conductive material is one of a doped semiconductor material, such as doped silicon or doped germanium, a conductive metal nitride, such as titanium nitride or tantalum nitride, a metal, such as tungsten, titanium, or tantalum, or a metal-semiconductor compound, such as tungsten silicide, cobalt silicide, or titanium silicide. The gate dielectric pattern GI is formed of or includes at least one of, for example, silicon oxide, silicon nitride, and/or silicon oxynitride. The gate capping pattern GC is formed of or includes at least one of, for example, silicon oxide, silicon nitride, and/or silicon oxynitride.

A first impurity injection region 110*a* and a second impurity injection region 110*b* are provided in each of the active patterns ACT. The second impurity injection regions 110*b* are spaced apart from each other with the first impurity injection region 110*a* interposed therebetween. The first impurity injection region 110*a* is provided between a pair of the word lines WL that cross each of the active patterns ACT. The second impurity injection regions 110*b* are spaced apart from each other with the pair of word lines WL interposed therebetween. The first impurity injection region 110*a* contains impurities of the same conductivity type as those of the second impurity injection regions 110*b*.

An insulating layer 120 is disposed on the substrate 100 and covers the active patterns ACT, the device isolation layer 102, and the word lines WL. In an embodiment, the insulating layer 120 is formed of or includes at least one of silicon oxide, silicon nitride, or silicon oxynitride and may have a single- or multi-layered structure.

Bit lines BL are disposed on the substrate 100 and on the insulating layer 120. The bit lines BL cross the word lines WL. The bit lines BL extend in the first direction D1 and are spaced apart from each other in the second direction D2. Each of the bit lines BL includes a polysilicon pattern 130, an ohmic pattern 132, and a metal-containing pattern 134 that are sequentially stacked on the insulating layer 120. The polysilicon pattern 130 is formed of or includes doped or undoped polysilicon. The ohmic pattern 132 is formed of or includes at least one metal silicide. The metal-containing pattern 134 is formed of or includes at least one of a metal, such as tungsten, titanium, or tantalum, or a conductive metal nitride, such as titanium nitride, tantalum nitride, or tungsten nitride.

A lower capping pattern 140 and an upper capping pattern 142 are sequentially stacked on each of the bit lines BL. The lower capping pattern 140 is disposed between each of the bit lines BL and the upper capping pattern 142. The lower capping pattern 140 and the upper capping pattern 142 extend in the first direction D1 along a top surface of each of the bit lines BL. The lower capping pattern 140 is formed of or includes at least one of a nitride, such as silicon nitride, or an oxynitride, such as silicon oxynitride, and the upper capping pattern 142 is formed of or includes at least one nitride, such as silicon nitride.

Bit line contacts DC are disposed below each of the bit lines BL and are spaced apart from each other in the first direction D1. Each of the bit line contacts DC penetrates the polysilicon pattern 130 and the insulating layer 120 and is electrically connected to the first impurity injection region 110*a* of a corresponding active pattern ACT. The ohmic pattern 132 and the metal-containing pattern 134 cover top surfaces of the bit line contacts DC. The bit line contacts DC are formed of or include at least one of a doped semiconductor material, such as doped silicon or doped germanium, a conductive metal nitride, such as titanium nitride or tantalum nitride, a metal, such as tungsten, titanium, or tantalum, or a metal-semiconductor compound, such as tungsten silicide, cobalt silicide, or titanium silicide.

A bit line spacer 150 is disposed on a side surface of each of the bit lines BL. The bit line spacer 150 extends along the side surface of each of the bit lines BL or in the first direction D1. The bit line spacer 150 extends from the side surface of each of the bit lines BL to a side surface of the lower capping pattern 140 and a side surface of the upper capping pattern 142. The bit line spacer 150 includes a first spacer 151, a second spacer 155, and a third spacer 157 that are sequentially stacked on the side surface of each of the bit lines BL. The first spacer 151 and the second spacer 155 are disposed on the insulating layer 120, and the bottommost surface of the first spacer 151 and the bottommost surface of the second spacer 155 are in contact with a top surface of the insulating layer 120. The third spacer 157 covers a side surface of the insulating layer 120, and the bottommost surface of the third spacer 157 is in contact with a top surface of the substrate 100. The first to third spacers 151, 155, and 157 cover the side surface of the lower capping pattern 140 and the side surface of the upper capping pattern 142. The first spacer 151 and the third spacer 157 are formed of or include the same insulating material, such as silicon nitride. In an embodiment, the second spacer 155 is formed of or includes an insulating material, such as silicon oxide, that has an etch selectivity with respect to the first and third spacers 151 and 157. In an embodiment, the second spacer 155 is an air gap region.

A gapfill insulating pattern 153 is disposed on a side surface of each of the bit line contacts DC. The gapfill insulating pattern 153 is formed of or includes at least one of silicon oxide, silicon nitride, or silicon oxynitride. The first spacer 151 extends into a region between the side surface of each of the bit line contacts DC and the gapfill insulating pattern 153 and further extends into a region between the device isolation layer 102 and the gapfill insulating pattern 153. An insulating liner 152 is interposed between the first spacer 151 and the gapfill insulating pattern 153. The gapfill insulating pattern 153 is spaced apart from the first spacer 151 with the insulating liner 152 interposed therebetween. At least a portion of the insulating liner 152 extends into a region between the first spacer 151 and the third spacer 157 and is in contact with the bottommost surface of the second spacer 155. The gapfill insulating pattern 153 is in contact with the bottommost surface of the third spacer 157. In an embodiment, the insulating liner 152 is formed of or includes silicon oxide.

Storage node contacts BC are disposed between adjacent bit lines BL, and are spaced apart from each other in the first direction D1. Each of the storage node contacts BC is electrically connected to a corresponding second impurity injection region 110*b* in each of the active patterns ACT. The storage node contacts BC are formed of or include doped or undoped polysilicon. Insulating fences are disposed between the storage node contacts BC. The insulating fences and the storage node contacts BC between adjacent bit lines BL are alternately arranged in the first direction D1. In an embodiment, the insulating fences are formed of or include silicon nitride. The bit line spacer 150 is interposed between each of the bit lines BL and the storage node contacts BC.

Landing pads LP are disposed on the storage node contacts BC. The landing pads LP are formed of or include a metal, such as tungsten. An upper portion of each of the landing pads LP covers a top surface of the upper capping pattern 142 and is wider than each of the storage node contacts BC. The upper portion of each of the landing pads LP laterally extends in the second direction D2 or in an opposite direction of the second direction D2 from each of the storage node contacts BC. The upper portion of each of the landing pads LP vertically overlaps a corresponding bit line BL. In addition, a storage node ohmic layer and a diffusion prevention pattern are interposed between each of the storage node contacts BC and each of the landing pads LP. The storage node ohmic layer is formed of or includes at least one metal silicide. The diffusion prevention pattern is formed of or includes at least one metal nitride, such as titanium nitride or tantalum nitride.

An upper insulating layer 160 fills a space between adjacent landing pads LP. The upper insulating layer 160 partially penetrates the upper capping pattern 142 and the lower capping pattern 140 and is in contact with top surfaces of the first to third spacers 151, 155, and 157. In an embodiment, the upper insulating layer 160 is formed of or includes at least one of silicon oxide, silicon nitride, or silicon oxynitride.

Bottom electrodes BE are disposed on the landing pads LP. The bottom electrodes BE are formed of or include at least one of doped poly-silicon, a metal nitride, such as titanium nitride, or a metal, such as tungsten, aluminum, or copper. Each of the bottom electrodes BE has one of a pillar shape, a hollow cylinder shape with one closed end, such as a cup shape, or a semi-pillar shape, as described with reference to FIGS. 4 to 6. An upper supporting pattern 232 is provided that supports upper side surfaces of the bottom electrodes BE, and a lower supporting pattern 230 is provided that supports lower side surfaces of the bottom electrodes BE. The upper and lower supporting patterns 232 and 230 are formed of or include at least one insulating materials, such as silicon nitride, silicon oxide, or silicon oxynitride.

An etch stop layer 210 is disposed between the bottom electrodes BE and covers the upper insulating layer 160. The etch stop layer 210 is formed of or includes at least one insulating material, such as silicon nitride, silicon oxide, or silicon oxynitride.

A dielectric layer 220 covers the bottom electrodes BE and the upper and lower supporting patterns 232 and 230. The dielectric layer 220 has substantially the same features as the dielectric layer 220 described with reference to FIGS. 1 to 3. For example, the dielectric layer 220 has a multi-layered structure in which at least one first dielectric layer 222 and at least one second dielectric layer 224 are stacked in a direction perpendicular to an interface between each of the bottom electrodes BE and the dielectric layer 220, as described with reference to FIGS. 1 to 3.

A top electrode TE is disposed on the dielectric layer 220 and fills a space between the bottom electrodes BE and between the upper and lower supporting patterns 232 and 230. The top electrode TE is formed of or includes at least one of doped poly-silicon, doped silicon germanium, a metal nitride, such as titanium nitride, or a metal, such as tungsten, aluminum, or copper. The bottom electrodes BE, the dielectric layer 220, and the top electrode TE constitute a capacitor CAP.

Figure 10:
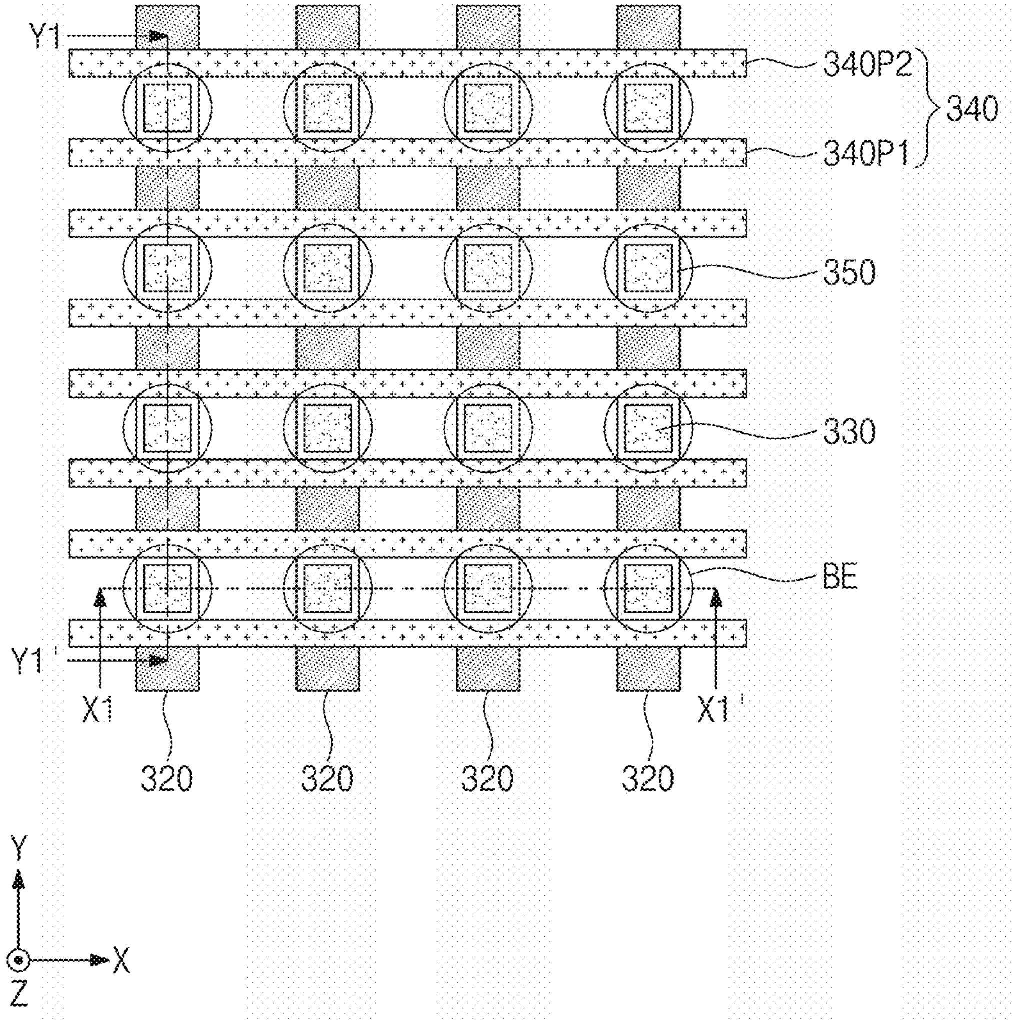
FIG. 10 is a plan view of a semiconductor device according to an embodiment of the inventive concept.
Figure 11:
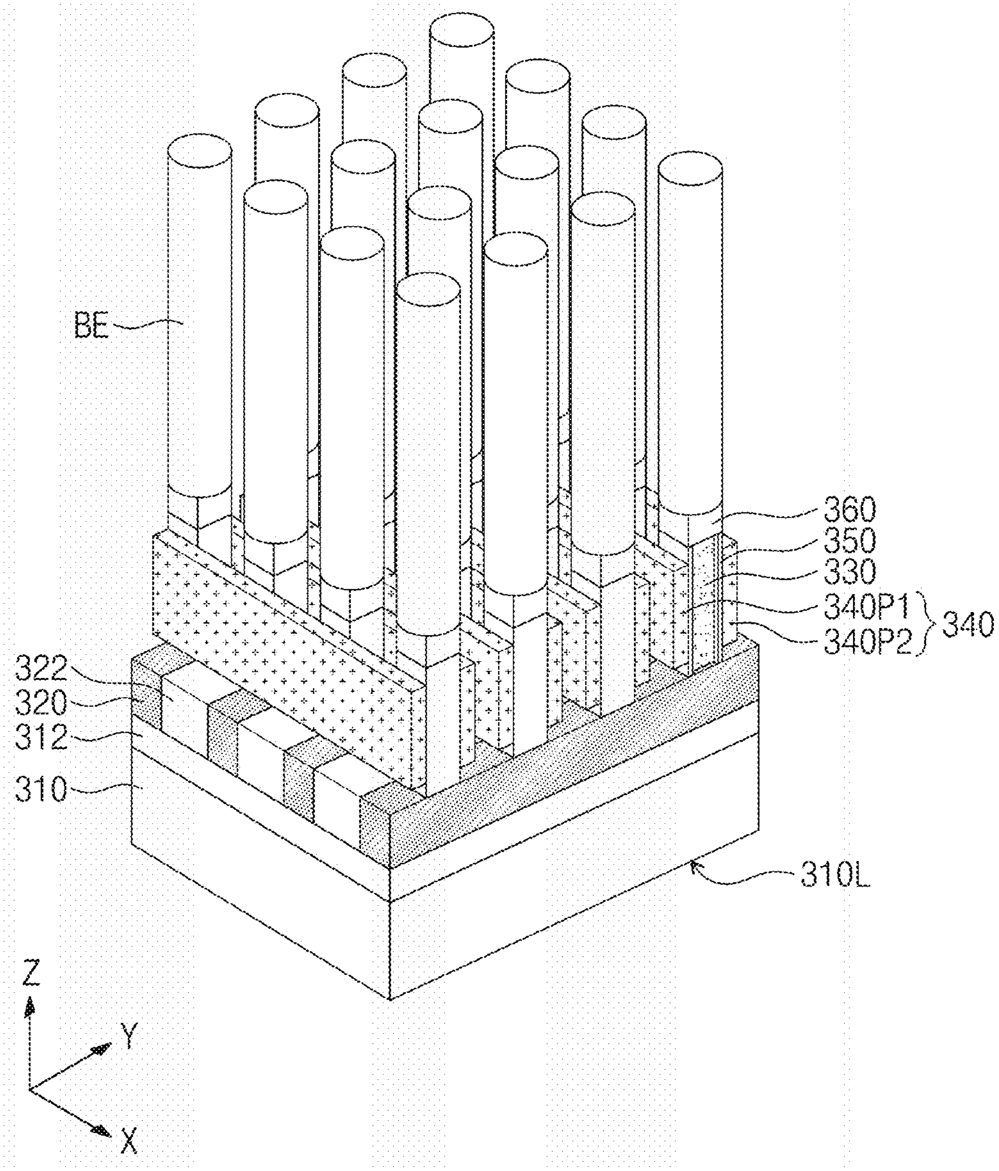
FIG. 11 is a perspective view of a semiconductor device according to an embodiment of the inventive concept.

FIG. 10 is a plan view of a semiconductor device according to an embodiment of the inventive concept. FIG. 11 is a perspective view of a semiconductor device according to an embodiment of the inventive concept, and FIG. 12 is a sectional view taken along lines X1-X1' and Y1-Y1' of FIG. 10.

Figure 12:
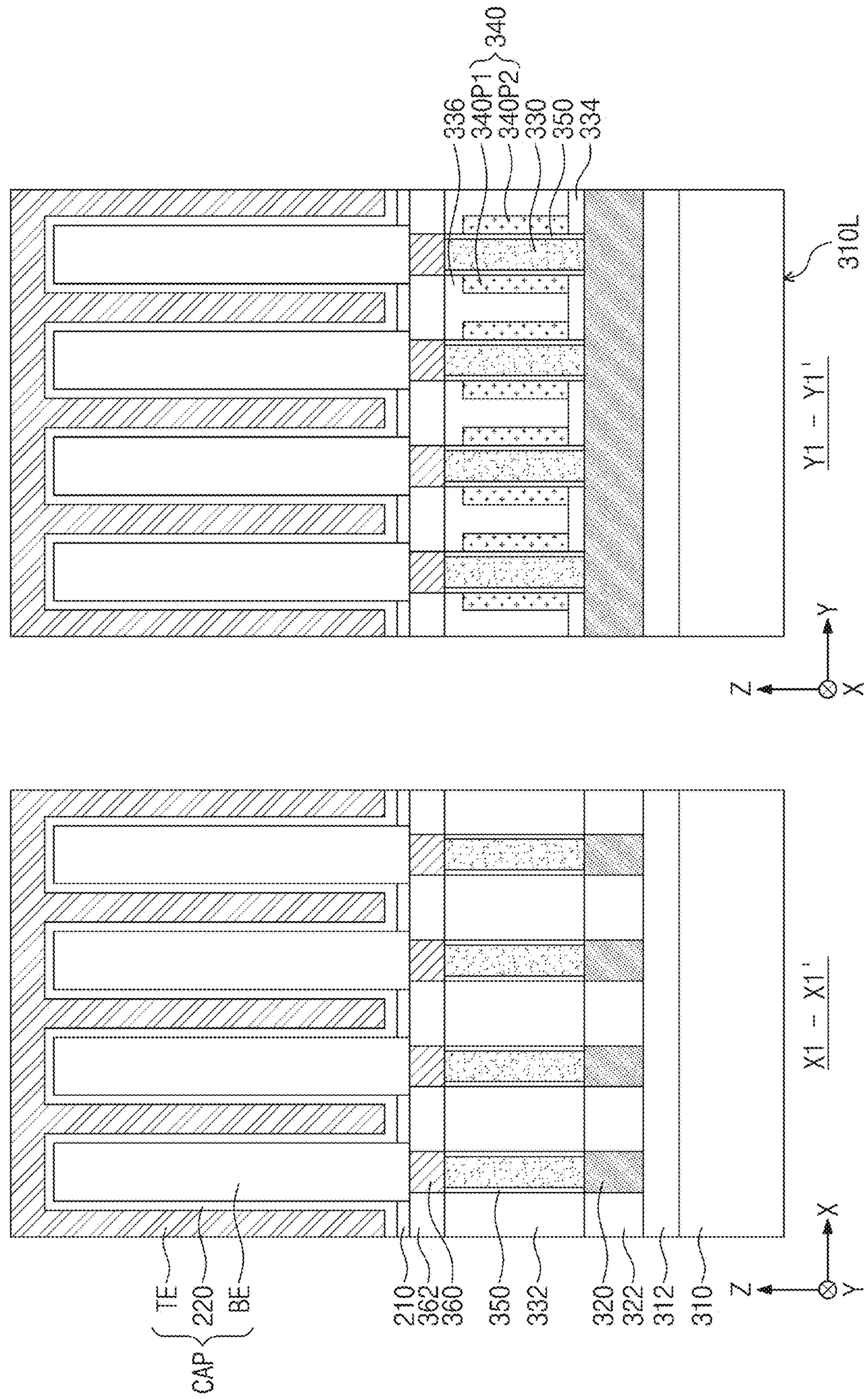
FIG. 12 is a sectional view taken along lines X1-X1' and Y1-Y1' of FIG. 10.

Referring to FIGS. 10 to 12, in an embodiment, a semiconductor device includes a substrate 310, a plurality of first conductive lines 320, a channel layer 330, a gate electrode 340, a gate insulating layer 350, and a capacitor structure CAP. In an embodiment, the semiconductor device is a memory device that includes a vertical channel transistor (VCT). The vertical channel transistor includes a vertically-extended channel pattern, such as the channel layer 330 extending from the substrate 310 in a vertical direction.

A lower insulating layer 312 is disposed on the substrate 310, and the first conductive lines 320 are disposed on the lower insulating layer 312. The first conductive lines 320 are spaced apart from each other in a first direction, such as an x direction, and extend in a second direction, such as a y direction. The first and second directions, such as the x and y directions, are parallel to a bottom surface 310L of the substrate 310 but are not parallel to each other. In an embodiment, the first and second directions are perpendicular to each other. A plurality of first insulating patterns 322 are disposed on the lower insulating layer 312 and between the first conductive lines 320. The first insulating patterns 322 extend in the second direction, such as the y direction, and top surfaces of the first insulating patterns 322 are coplanar with top surfaces of the first conductive lines 320. The first conductive line 320 are used as bit lines.

The first conductive lines 320 are formed of or include at least one of doped polysilicon, a metal, a conductive metal nitride, a conductive metal silicide, a conductive metal oxide, or combinations thereof. For example, the first conductive lines 320 are formed of or include at least one of doped polysilicon, Al, Cu, Ti, Ta, Ru, W, Mo, Pt, Ni, Co, TiN, TaN, WN, NbN, TiAl, TiAIN, TiSi, TiSiN, TaSi, TaSiN, RuTiN, NiSi, CoSi, IrOx, RuOx, or combinations thereof, but embodiments of the inventive concept are not necessarily limited to these examples. Each of the first conductive lines 320 may include one or more layers formed of at least one of the afore-described materials. In an embodiment, the first conductive lines 320 includes a two-dimensional semiconductor, such as graphene, carbon nanotube, or combinations thereof.

In an embodiment, the channel layers 330 are disposed on the first conductive line 320 and are spaced apart from each other in the first and second directions, such as the x and y directions, and to form a matrix pattern. The channel layer 330 has a vertical channel structure that extends in a third direction, such as a z direction, perpendicular to the bottom surface 310L of the substrate 310. The channel layer 330 has a first width in the first direction, such as the x direction, and a first height in the third direction, such as the z direction, where the first height is greater than the first width. For example, the first height is about 2 to 10 times the first width, but embodiments of the inventive concept are not necessarily limited to this example. In an embodiment, the channel layer 330 has a second width in the second direction, such as the y direction, and the second width is substantially equal to the first width. A lower portion of the channel layer 330 serves as a first source/drain region, an upper portion of the channel layer 330 serves as a second source/drain region, and a portion of the channel layer 330 between the first and second source/drain regions serves as a channel region.

The channel layer 330 is formed of or includes at least one of an oxide semiconductor, such as InxGayZnzO, InxGaySizO, InxSnyZnzO, InxZnyO, ZnxO, ZnxSnyO, ZnxOyN, ZrxZnySnzO, SnxO, HfxInyZnzO, GaxZnySnzO, AlxZnySnzO, YbxGayZnzO, InxGayO, or combinations thereof. The channel layer 330 includes one or more layers formed of at least one of the oxide semiconductors. The channel layer 330 has a band gap energy that is greater than a band gap energy of silicon. In an embodiment, the channel layer 330 has a band gap energy of about 1.5 eV to 5.6 eV. For example, the channel layer 330 exhibits an optimized channel performance when the channel layer 330 has a band gap energy of about 2.0 eV to 4.0 eV. The channel layer 330 has a polycrystalline or amorphous structure, but embodiments of the inventive concept are not necessarily limited to this example. In an embodiment, the channel layer 330 includes a two-dimensional semiconductor, such as graphene, carbon nanotube, or combinations thereof.

The gate electrodes 340 are provided on opposite side surfaces of the channel layer 330 and extend in the first direction, such as the x direction. The gate electrode 340 includes a first sub-gate electrode 340P1 and a second sub-gate electrode 340P2 that are respectively face two opposite side surfaces, such as first and second side surfaces, of the channel layer 330. A channel layer 330 is disposed between the first sub-gate electrode 340P1 and the second sub-gate electrode 340P2, and the semiconductor device has a dual gate transistor structure. However, embodiments of the inventive concept are not necessarily limited to this example. In an embodiment, the second sub-gate electrode 340P2 is omitted, and only the first sub-gate electrode 340P1 that faces the first side surface of the channel layer 330 is formed. The semiconductor device has a single gate transistor structure.

The gate electrode 340 is formed of or includes at least one of doped polysilicon, a metal, a conductive metal nitride, a conductive metal silicide, a conductive metal oxide, or combinations thereof. For example, the gate electrode 340 is formed of or includes at least one of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or combinations thereof, but embodiments of the inventive concept are not necessarily limited to these examples.

The gate insulating layer 350 encloses the channel layer 330 or covers side surfaces of the channel layer 330 and is interposed between the channel layer 330 and the gate electrode 340. In an embodiment, as shown in FIG. 10, the entire side surface of the channel layer 330 is covered with the gate insulating layer 350 and a portion of a side surface of the gate electrode 340 is in contact with the gate insulating layer 350. In an, the gate insulating layer 350 extends in an extension direction, such as the first or x direction, of the gate electrode 340, and only two of the side surfaces of the channel layer 330 that face the gate electrode 340 are in contact with the gate insulating layer 350.

The gate insulating layer 350 is formed of or includes at least one of silicon oxide, silicon oxynitride, a high-k dielectric material whose dielectric constant is greater than that of the silicon oxide, or combinations thereof. The high-k dielectric material includes a metal oxide material or a metal oxynitride material. For example, the high-k dielectric materials include $HfO_2$, HfSiO, HfSiON, HfTaO, HfTiO, HfZrO, $ZrO_2$, $Al_2O_3$, or combinations thereof.

A plurality of second insulating patterns 332 are disposed on the first insulating patterns 322 and the first conductive lines 320. The second insulating patterns 332 extend in the second direction, such as the y direction, and the channel layer 330 is disposed between adjacent second insulating patterns 332. In addition, a first gapfill layer 334 and a second gapfill layer 336 are disposed in a space between adjacent second insulating patterns 332 and between adjacent channel layers 330. The first gapfill layer 334 is disposed in a bottom portion of a space between adjacent channel layers 330, and the second gapfill layer 336 is formed on the first gapfill layer 334 and fills a remaining portion of the space between the adjacent channel layers 330. A top surface of the second gapfill layer 336 is coplanar with a top surface of the channel layer 330, and the second gapfill layer 336 covers a top surface of the gate electrode 340. Alternatively, in an embodiment, the first insulating patterns 322 and the second insulating patterns 332 are formed of a continuous material layer and/or the first gapfill layer 334 and the second gapfill layer 336 are formed of a continuous material layer.

A capacitor contact 360 is disposed on the channel layer 330. In an embodiment, the capacitor contacts 360 vertically overlaps the channel layers 330 and are spaced apart from each other in the first and second directions, such as the x and y directions, or to form a matrix pattern. The capacitor contact 360 is formed of or includes at least one of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or combinations thereof, but embodiments of the inventive concept are not necessarily limited to these examples. An upper insulating layer 362 is provided on the second insulating patterns 332 and the second gapfill layer 336 and encloses side surfaces of the capacitor contacts 360.

An etch stop layer 210 is disposed on the upper insulating layer 362, and the capacitor CAP is disposed on the etch stop layer 210. The capacitor CAP includes bottom electrodes BE that are horizontally spaced apart from each other, a dielectric layer 220 that covers the bottom electrodes BE, and a top electrode TE that covers the dielectric layer 220 and the bottom electrodes BE.

Each of the bottom electrodes BE penetrates the etch stop layer 210 and is electrically connected to a top surface of the capacitor contact 360. Each of the bottom electrodes BE has one of a pillar shape, a hollow cylinder shape with one closed end, such as a cup shape, or a semi-pillar shape, as described with reference to FIGS. 4 to 6. Each of the bottom electrodes BE vertically overlaps the capacitor contact 360. The bottom electrodes BE are spaced apart from each other in the first and second directions, such as x and y directions, or to form a matrix pattern. Alternatively, in an embodiment, landing pads are further disposed between the capacitor contact 360 and the bottom electrodes BE, and the bottom electrodes BE are arranged in a hexagonal pattern. The bottom and top electrodes BE and TE have substantially the same features as the bottom and top electrodes BE and TE described with reference to FIGS. 4 to 6.

The dielectric layer 220 covers the bottom electrodes BE. The dielectric layer 220 has substantially the same features as the dielectric layer 220 described with reference to FIGS. 1 to 3. For example, the dielectric layer 220 has a multi-layered structure in which at least one first dielectric layer 222 and at least one second dielectric layer 224 are stacked in a direction perpendicular to an interface between each of the bottom electrodes BE and the dielectric layer 220, as described with reference to FIGS. 1 to 3.

According to an embodiment of the inventive concept, a dielectric layer of a capacitor structure has a multi-layered structure in which an anti-ferroelectric or electric field-induced phase transition first dielectric layer and a ferroelectric second dielectric layer are stacked. By adjusting a difference between thermal expansion coefficients of the first and second dielectric layers, e.g., to a value greater than or equal to $3.0\times10^{-6}$/K, a tensile or compressive stress at an interface between the first and second dielectric layers can be provided, and in this case, a fine structure of the dielectric layer, such as a crystal phase and a grain size in the first and second dielectric layers, is controlled to maximize an electrostatic capacitance of the capacitor structure.

Accordingly, in a semiconductor device and a fabrication method according to an embodiment of the inventive concept, the electrostatic capacitance of the capacitor structure can be increased and the fine structure of the dielectric layer can be controlled.

While embodiments of the inventive concept have been particularly shown and described, it will be understood by one of ordinary skill in the art that variations in form and detail may be made therein without departing from the spirit and scope of the attached claims.

What is claimed is:

1. A semiconductor device, comprising:

a first conductive line on a substrate, wherein the first conductive line extends in a horizontal direction parallel to a bottom surface of the substrate;

a vertical channel structure on the first conductive line, wherein the vertical channel structure extends in a vertical direction perpendicular to the bottom surface of the substrate; and a capacitor on the vertical channel structure, wherein the capacitor comprises:

a bottom electrode connected to the vertical channel structure;

a top electrode that covers the bottom electrode; and a dielectric layer interposed between the bottom electrode and the top electrode, wherein the dielectric layer comprises:

a first dielectric layer between the bottom electrode and the top electrode; and a second dielectric layer between the first dielectric layer and the top electrode, wherein the first dielectric layer is anti-ferroelectric, the second dielectric layer is ferroelectric, and a thermal expansion coefficient of the first dielectric layer is greater than a thermal expansion coefficient of the second dielectric layer.

2. The semiconductor device of claim 1, wherein a difference between the thermal expansion coefficient of the first dielectric layer and the thermal expansion coefficient of the second dielectric layer is greater than or equal to $3.0\times10^{-6}$/K.

3. The semiconductor device of claim 1, wherein the first dielectric layer comprises an anti-ferroelectric first crystal phase, and the first crystal phase is at least one of a tetragonal phase, an orthorhmobic phase, or a rhombohedral phase.

4. The semiconductor device of claim 3, wherein the second dielectric layer comprises a ferroelectric second crystal phase, and the second crystal phase is at least one of a tetragonal phase, an orthorhmobic phase, or a rhombohedral phase.

5. The semiconductor device of claim 4, wherein the first dielectric layer further comprises a paraelectric sub-crystal phase, the sub-crystal phase is a monoclinic phase, and in the first dielectric layer, a fraction of the first crystal phase is greater than a fraction of the sub-crystal phase.

6. The semiconductor device of claim 4, wherein the second dielectric layer further comprises a paraelectric sub-crystal phase, the sub-crystal phase is a monoclinic phase, and in the second dielectric layer, a fraction of the second crystal phase is greater than a fraction of the sub-crystal phase.

7. The semiconductor device of claim 4, wherein, in the dielectric layer, a fraction of the first crystal phase is greater than a fraction of the second crystal phase.

8. The semiconductor device of claim 7, wherein at least one of the first and second dielectric layers further comprises a paraelectric sub-crystal phase, the sub-crystal phase is a monoclinic phase, and in the dielectric layer, a fraction of the sub-crystal phase is less than the fraction of the first crystal phase and the fraction of the second crystal phase.

9. The semiconductor device of claim 1, wherein each of the first and second dielectric layers has a thickness in a direction perpendicular to an interface between the bottom electrode and the dielectric layer, and the thickness of the first dielectric layer is greater than the thickness of the second dielectric layer.

10. The semiconductor device of claim 1, wherein a plurality of the first dielectric layers are provided, a plurality of the second dielectric layers are provided, and the dielectric layer comprises the plurality of first dielectric layers and the plurality of second dielectric layers that are alternately stacked in a direction perpendicular to an interface between the bottom electrode and the dielectric layer.

11. A semiconductor device, comprising:

a plurality of first conductive lines on a substrate, wherein the plurality of first conductive lines are spaced apart from each other in a first direction and extend in a second direction, and the first and second directions are parallel to a bottom surface of the substrate and cross each other;

vertical channel structures on the first conductive lines, wherein the vertical channel structures are spaced apart from each other in the first and second directions and extend in a third direction perpendicular to the bottom surface of the substrate; and a capacitor on the vertical channel structures, wherein the capacitor comprises:

a plurality of bottom electrodes respectively connected to the vertical channel structures;

a top electrode that covers the bottom electrodes; and a dielectric layer interposed between each of the bottom electrodes and the top electrode, wherein the dielectric layer comprises:

a first dielectric layer between each of the bottom electrodes and the top electrode; and a second dielectric layer between the first dielectric layer and the top electrode, wherein the first dielectric layer comprises an anti-ferroelectric first crystal phase, the second dielectric layer comprises a ferroelectric second crystal phase, at least one of the first and second dielectric layers further comprises a paraelectric sub-crystal phase, and in the dielectric layer, a fraction of the sub-crystal phase is less than a fraction of the first crystal phase and a fraction of the second crystal phase.

12. The semiconductor device of claim 11, wherein a plurality of the first dielectric layers are provided, a plurality of the second dielectric layers are provided, and the dielectric layer comprises the plurality of first dielectric layers and the plurality of second dielectric layers that are alternately stacked in a direction perpendicular to an interface between each of the bottom electrodes and the dielectric layer.

13. The semiconductor device of claim 11, wherein the first crystal phase is at least one of a tetragonal phase, an orthorhmobic phase, or a rhombohedral phase.

14. The semiconductor device of claim 11, wherein the second crystal phase is at least one of a tetragonal phase, an orthorhmobic phase, or a rhombohedral phase.

15. The semiconductor device of claim 11, wherein the sub-crystal phase is a monoclinic phase.

16. The semiconductor device of claim 11, wherein each of the first and second dielectric layers has a thickness in a direction perpendicular to an interface between each of the bottom electrodes and the dielectric layer, and the thickness of the first dielectric layer is greater than the thickness of the second dielectric layer.

17. The semiconductor device of claim 11, wherein a thermal expansion coefficient of the first dielectric layer is greater than a thermal expansion coefficient of the second dielectric layer.

18. The semiconductor device of claim 17, wherein a difference between the thermal expansion coefficient of the first dielectric layer and the thermal expansion coefficient of the second dielectric layer is greater than or equal to $3.0\times10^{-6}$/K and is less than or equal to $10.0\times10^{-6}$/K.

19. The semiconductor device of claim 11, wherein the fraction of the first crystal phase is greater than the fraction of the second crystal phase.

20. The semiconductor device of claim 11, further comprising:

gate electrodes on opposite side surfaces of each of the vertical channel structures, wherein the gate electrodes extend in the first direction and are spaced apart from each other on the second direction.

* * * * *